US005262282A

United States Patent [19]
Hieda et al.

[11] Patent Number: 5,262,282
[45] Date of Patent: Nov. 16, 1993

[54] PATTERN FORMING METHOD

[75] Inventors: Katsuhiko Hieda; Iwao Higashikawa, both of Tokyo, Japan

[73] Assignee: Kabushiki Kaisha Toshiba, Kawasaki, Japan

[21] Appl. No.: 908,918

[22] Filed: Jul. 2, 1992

Related U.S. Application Data

[63] Continuation of Ser. No. 544,104, Jun. 22, 1990, abandoned.

[30] Foreign Application Priority Data

Jun. 22, 1989 [JP] Japan ................................. 1-158364

[51] Int. Cl.$^5$ .............................................. G03F 7/26
[52] U.S. Cl. .................................... 430/323; 430/313;
430/314; 430/322; 430/324; 430/325; 430/329;
430/330
[58] Field of Search ............... 430/313, 315, 314, 316,
430/322, 323, 324, 325, 329, 330, 331, 394, 396

[56] References Cited

U.S. PATENT DOCUMENTS 4,751,170 6/1988 Mimura et al. ..................... 430/313
4,999,280 3/1991 Hiraoka ............................. 430/313

OTHER PUBLICATIONS

Coopmans et al., "DESIRE: A Novel Dry Developed Resist System", 1986 SPIE, vol. 631, Advances in Resist Tech. and Processing III, pp. 34–39.

*Primary Examiner*—Marion E. McCamish
*Assistant Examiner*—Kathleen Duda
*Attorney, Agent, or Firm*—Oblon, Spivak, McClelland, Maier & Neustadt

[57] ABSTRACT

A pattern forming method of a resist to be used in the manufacturing process of a semiconductor device. The desired area of a resist film is made hydrophilic by an exposure and a mask material is precipitated and deposited on the area of resist film made hydrophilic in the solution. The patterning of resist film is thus carried out, and a pattern of high reliability is formed. After exposure, by silylizing or baking the resist film, a pattern of higher reliability is formed. Furthermore, after patterning of the resist film, the precipitation and deposition of the mask material are carried out again, and a reversed pattern of high reliability is formed by eliminating the resist film made with patterning by the lift-off process.

22 Claims, 3 Drawing Sheets

PATTERN FORMING METHOD

This application is a continuation of application Ser. No. 07/544,104, filed on Jun. 22, 1990, now abandoned.

BACKGROUND OF THE INVENTION

1. Field of the Invention

The present invention relates to a pattern forming method of resists used in the manufacturing process of semiconductor devices.

2. Discussion of the Background

Together with the progress of semiconductor technology, high speed and high integration implementations of semiconductor devices, in its turn, semiconductor devices have been improved. Accompanied by this, the pattern wire width formed on a semiconductor substrate has been reduced to submicrons, and a lithography technique required for their production and the performance required for resist materials have become more severely needed.

The light source used in the lithography technique is moving in the direction of short wavelengths from the present ultraviolet rays, KrF excimer rays (248 nm of wavelength), etc. Against this trend, the development of resist materials is also progressing, but it is not easy to form patterns of a lower submicron size to cut 0.5 μm.

As a means to solve this problem, a multilayer resist process has been proposed. The multilayer resist process is to share a role charged to the resist by making it multilayer. That is to say, as the basic method of the multilayer resist process, first, a first resist layer of 2 to 3 μm of thickness is formed on the substrate, the steps on the chip surface are made flat, and the reflected light from the ground is absorbed by this resist layer. By carrying out the patterning by the resist layer of high resolution as the second resist layer thereon, the exposure development can be carried out under ideal conditions separated from the ground, and patterns with good dimensional precision are formed at high resolution.

However, the above-mentioned resist process has technical problems, such as the occurrence of pinholes, the occurrence of cracks and curvature by the stress generated between resist layers of different kinds, sophistication of process, pattern conversion difference at patterning of the lower layer, etc.

As a means to solve the problems of the multilayer resist, there is a process called "DESIRE" ("DESIRE: a novel dry developed resist system", Fedor Coopmans, Bruno Roland, pp 34-pp 39, SPIE Vol. 631, Advances in Resist Technology and Processing III (1986)).

This typical process is shown in process cross sectional views in FIGS. 1(a) to 1(d).

That is to say, a resist layer 2 is coated on the surface of a substrate 1 (FIG. 1 (a)). Next, the exposure is carried out using exposure rays 4 like ultraviolet rays, etc., through a mask 3, and an exposure region 5 is formed in the resist layer 2 (FIG. 1 (b)). Against this exposure region 5, the silicon compound is selectively absorbed, and a silylation layer 6 is formed on the surface of the resist layer (FIG. 1 (c)). In succession, the non-exposure region of the resist layer 2 is eliminated by dry etching such as reactive ion etching, etc., and a pattern with a mask of a silicon oxide film is obtained on the surface (FIG. 1 (d)).

The above is the pattern forming method by the typical silylation process. In this process, since absorbing the silicon compound in the exposure region is carried out in a gas atmosphere, the concentration of the silylation layer 6 is larger in profile, the more the surface is exposed to the gas atmosphere and smaller the more it comes into the film.

Therefore, a silicon oxide film 7 obtained from the silylation layer by the reactive etching is limitedly formed only on the surface of the resist layer 2. Since this silicon oxide film 7 is used as the mask for etching the substrate or for patterning the resist layer 2 of the ground, it is necessary to have an adequate film thickness. However, as described above, in this silylation process, since the silicon oxide film 7 is limitedly formed only on the surface of the resist layer 2 and the concentration of silicon oxide film is not always sufficient, the selectivity of patterning and etching is not good. Thus, there is a problem of reliability.

In the silylation process, the formation of the silicon oxide film is carried out by two steps of the process: exposing the resist layer 2 to the silicon compound gas and the reactive ion etching. As a result, the setting of process conditions was complicated in order to obtain the required silicon oxide film.

SUMMARY OF THE INVENTION

An object of the present invention is to provide an improved pattern forming method.

Another object of the present invention is to provide an improved new and reliable pattern forming method.

Briefly, in accordance with one aspect of the invention, there is provided a pattern forming method comprising the steps of: coating a resist film on a substrate, exposing the resist film to the prescribed pattern causing the exposed region to become hydrophilic, selectively extracting and depositing a mask material on the hydrophilic region of the substrate in a solution, and patterning the resist film using the mask material.

After the resist film formed on the substrate is exposed to the required pattern and the exposed region is made hydrophilic, if the substrate is immersed, for example, in a supersaturated solution containing silica, the silicon oxide film is extracted and deposited to become the mask material.

For example, in case the resist of acid anhydride

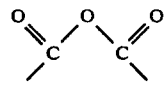

is used as the resist. This is hydrophobic, but if the exposure is carried out by ultraviolet rays, the bond between O and C=O of the structure is cut. It is then reacted with the water in the air, etc., and carboxylic acid

is formed on the exposed surface. Since this carboxylic acid is hydrophilic, the silicon oxide film is extracted and deposited from the supersaturated solution containing silica on the resist film where the surface became hydrophilic.

Since the silicon oxide film is also hydrophilic, the extraction and deposition of this silicon oxide film progresses even more on this oxide film. In such a way, a silicon oxide film of sufficient film thickness can be formed as the mask on the exposed region.

This silicon oxide film has a close structure, and is suitable to create a pattern very well in the resist film. Furthermore, the silicon oxide film is suitable to selectively etch the ground substrate. If novolac resin as the resist is exposed using ultraviolet rays, the exposed region becomes hydrophilic. Therefore, immersing it in a supersaturated solution containing silica resists the silicon oxide film formed on the hydrophilic region.

According to another characteristic of the present invention, after exposure and after silylating the resist film surface by the silicon compound gas, the mask material is extracted and deposited in the solution. Since layers of Si—O and Si—O—H are formed on the silylated resist film surface, the hydrophilic implementation is promoted. Therefore, the extraction and deposition of the mask material proceeds well.

According to still another characteristic of the present invention, after exposure, the substrate is baked, and then, the mask material is extracted and deposited in the solution. By baking the substrate, the silylation can be made certain.

According to still another characteristic of the present invention, after the pattern of resist film having extracted and deposited first mask material on the surface immerses the substrate formed in the solution and forms the second mask material on the substrate surface, the resist film is eliminated by a lift-off process, and the pattern of second mask material is formed on the surface of the substrate.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1A:
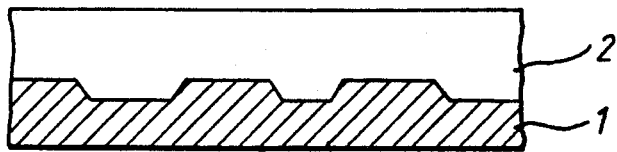
FIGS. 1(a) to 1(d) are cross sectional views to show the conventional pattern forming method.
Figure 1B:
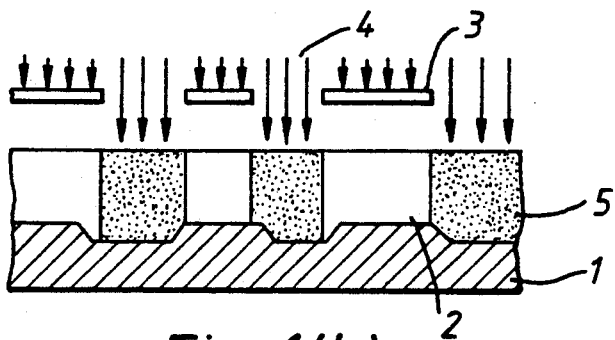
Figure 1C:
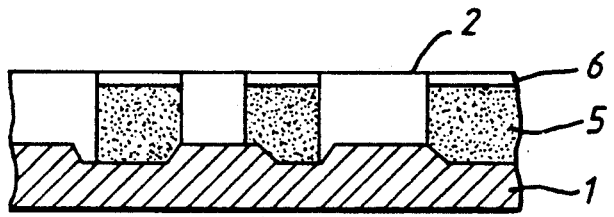
Figure 1D:
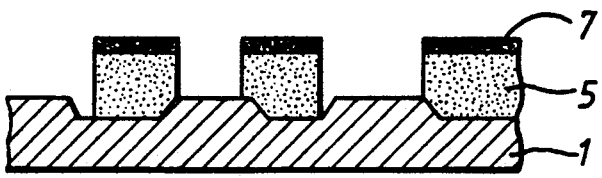

Various other objects, features, and attendant advantages of the present invention will be more fully appreciated as the same becomes better understood from the following detailed description when considered in connection with the accompanying drawings in which like reference characters designate like or corresponding parts throughout the several views and wherein FIGS. 2(a) to 2(d) show process cross sections of an embodiment of the present invention.

First, a substrate 11 is provided on which is formed, for example, a polycrystalline silicon film 12. The substrate 11 is, for example, to form the silicon oxide film on the silicon wafer on which circuit elements are formed, and causes uneven areas thereon.

Figure 2A:
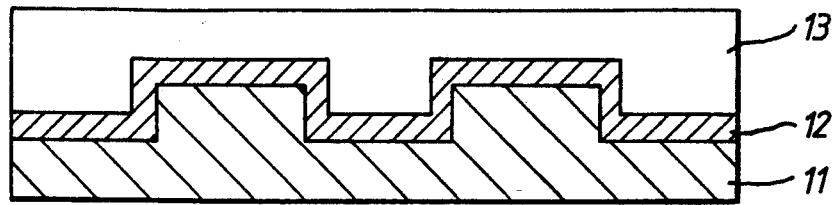
FIGS. 2(a) to 2(d) are cross sectional views to show the pattern forming method of the present invention.

Next, a resist film 13, for example a polymethyacrylic anhydride resin being the resin with acid anhydride structure is evenly spin-coated on this substrate (FIG. 2(a)).

The acrylic anhydride resin can be used as the resin with other acid anhydride structure.

Next, ultraviolet rays, here KrF excimer rays (248 nm of wavelength) are exposed through the mask on the surface of the substrate.

Figure 2B:
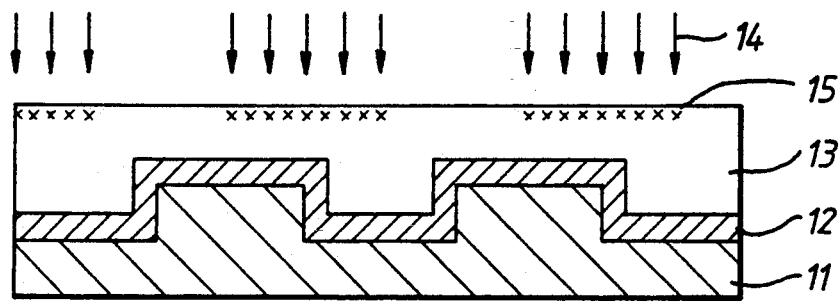
Figure 2C:
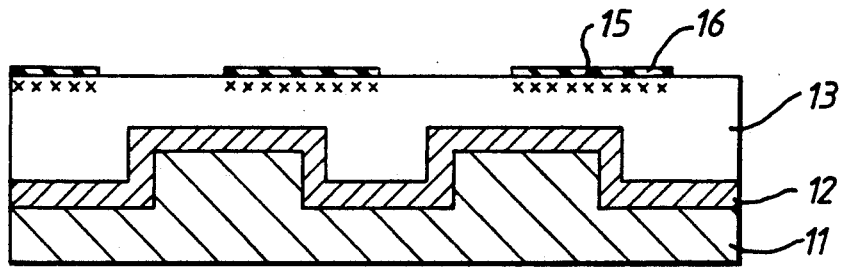

The resist film itself is hydrophobic, but the resist in the exposed region changes from hydrophobic to hydrophilic, and a hydrophilic resist layer 15 is formed (FIG. 2(b)).

Next, this substrate is immersed in supersaturated solution containing silica. A silicon oxide film 16 is precipitated and deposited, for example, to an extent of 300 Å on the hydrophilic resist layer 15 (FIG. 2(c)).

The supersaturated solution containing silica is made as follows:

First, a silicofluoric hydroacid ($H_2SiF_6$) aqueous solution of 40 weight % is diluted by water. A silicofluoric hydroacid solution of 3 mols/1 is made, with silica ($SiO_2$) applied to this until saturated. Then, aluminum plate (Al) is immersed in this solution, and the supersaturated solution containing silica is formed. The concentration of silicofluoric acid solution is not limited, in particular, to the above-mentioned value.

The above-mentioned reactions are expressed by the following equations:

$$H_2SiF_6 + 2H_2O \rightarrow SiO_2 + 6HF \quad (1)$$

$$2Al + 6HF \rightarrow 2AlF_3 + 3H_2 \quad (2)$$

That is to say, by reacting HF with Al in equation (1) and consuming, the HF concentration is lowered, and the deposition of $SiO_2$ film is produced. As the reaction temperature is raised, the reaction in (1) advances to the right, and the deposition of $SiO_2$ is increased.

Even if other silicohalogenated hydro-acid solutions are used, the deposition of $SiO_2$ film can similarly be carried out.

The extraction of 300 Å proceeds for 30 minutes at 35° C. of present liquid temperature. This silicon oxide film 16 has a very close structure.

Next, this silicon oxide film 16 is masked, and anisotrophic etching is carried out to the resist film 13 by reactive ion etching using oxygen gas ($O_2$). The resist film made with patterning by the anisotropic etching is made as a mask, and the polycrystalline silicon film 12 is processed by a reactive ion etching using a gas including chlorine, for example $Cl_2$.

Hereupon, the silicon oxide film 16 forming the mask of etching achieves a sufficient thickness, and a high selectivity can be maintained by the etching of the polycrystalline silicon film 12 of the ground compared with silicon oxide film formed by the silylation.

In the above-mentioned embodiment, an aluminum plate is immersed, but it is better to promote the deposition of silicon oxide film in such a way that the supersaturated solution containing silica adds silica to the silicofluoric acid solution, for example, by adding boric acid ($H_3BO_3$) aqueous solution.

Furthermore, the substrate is immediately immersed in the supersaturated solution containing silica in the above embodiment after exposure. However, baking can be carried out in the open air at 140° C. for about five minutes before immersion. This has a function to assure the hydrophilic property of the resist in the exposure area.

Furthermore, it is better to use the resist of naphthoquinonedinonoborac series, perform heat treatment of the exposed specimen, for example, in the reduced pressure gas atmosphere of hexamethyldisilazane as the silicon compound gas, silylize the resist in the exposure area, and by adding this silylation processing after exposure to promote the hydrophilic property implementation of the resist in the exposure section. As a result, the silicon oxide film on the resist is formed more selectively compared with only the silylation.

Even in the resin with acid anhydride structure like this embodiment, the similar silylation processing is possible.

Furthermore, the exposure can use ultraviolet rays, x-rays or electron beam in addition to the said KrF excimer light.

Figure 3A:
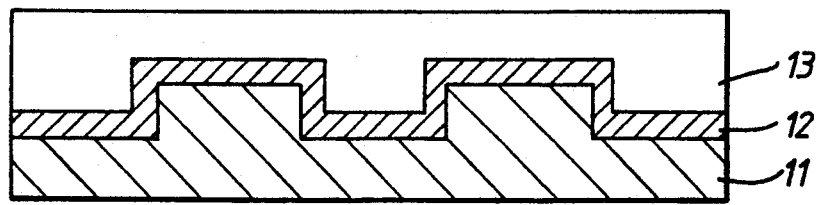
FIGS. 3(a) to 3(e) are cross sectional views to show another pattern forming method of the present invention.
Figure 3B:
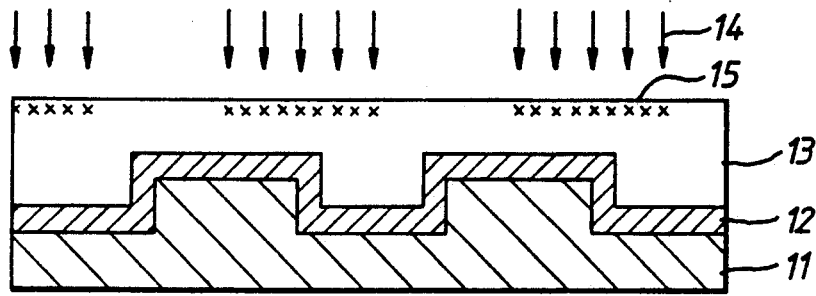
Figure 3C:
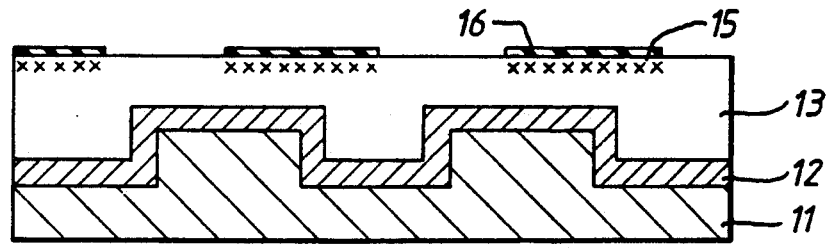

FIGS. 3(a) to 3(f) are cross sections to show another embodiment of the present invention. FIGS. 3(a) to 3(c) are the same steps explained in FIGS. 2(a) to 2(c). The silicon oxide film 16 is the first mask material.

Figure 3D:
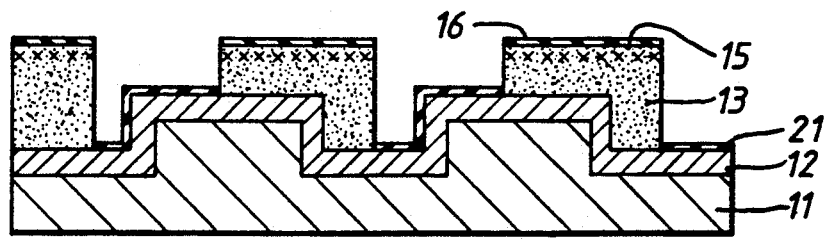
Figure 3E:
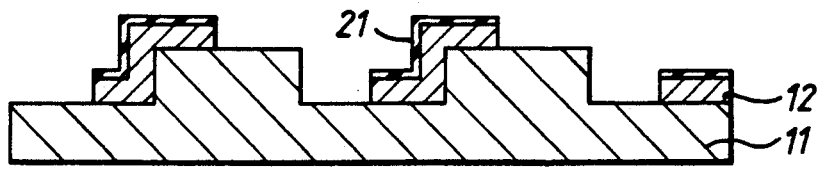

After this, anisotropic etching is performed for the resist film 13 by the reactive ion etching using $O_2$ gas, and moreover, this substrate is immersed in the supersaturated solution containing silica, and the silicon oxide film 21 is similarly extracted and deposited as the second mask material on the surface of the polycrystalline silicon film 12 of the material (FIG. 3(d)).

Next, removing the resist film 13 is performed using etching liquid, for example, a liquid mixture of hydrogen peroxide ($H_2O_2$) liquid and sulfuric acid ($H_2SO_4$). liquid. It is used as a resist stripper. Furthermore, the silicon oxide film 21 left by this lift-off is made to the second mask, and the polycrystalline silicon film 12 is processed by the second mask (FIG. 3(e)).

Figure 2D:
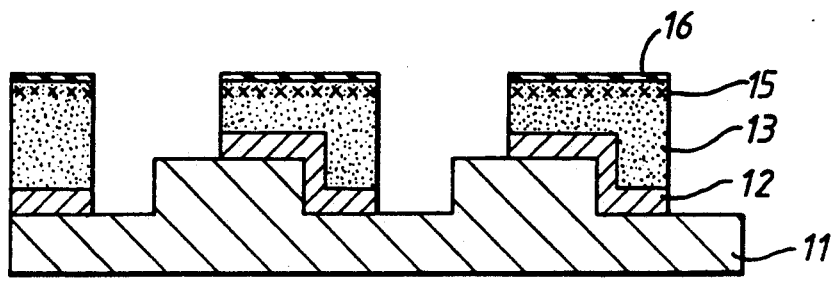

When following this procedure, it is possible to process (reverse processing) to the same pattern as the first mask using a positive type resist. As a result, an etching mask pattern, reverse to the pattern of FIG. 2(d) is formed.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A pattern forming method, comprising the steps of:
   coating a hydrophobic resist film on a substrate;
   exposing the resist film to a prescribed pattern causing an exposed region to become hydrophilic;
   selectively extracting and depositing a silicon oxide film from a silica liquid solution on the hydrophilic region of the substrate; and
   etching the resist film using the silicon oxide film as a mask.

2. The pattern forming method of claim 1, wherein the liquid solution is a supersaturated solution containing silica.

3. The pattern forming method of claim 1, wherein the exposure is carried out by using ultraviolet rays, X rays or electron beam.

4. The pattern forming method of claim 1, wherein the resist film includes a resin with acid anhydride structure.

5. The pattern forming method of claim 1, wherein the resist film includes a methacrylic acid anhydride resin or acrylic acid anhydride resin.

6. The pattern forming method of claim 1, wherein the resist film includes a novolac series resin.

7. A pattern forming method, comprising the steps of:
   coating a hydrophobic resist film on a substrate;
   exposing the resist film to a prescribed pattern causing an exposed region to become hydrophilic;
   silylizing the exposed region by a silicon compound gas and promoting a hydrophilic implementation;
   selectively extracting and depositing a silicon oxide film from a silica liquid solution on the hydrophilic region of the substrate; and
   etching the resist film using the silicon oxide film as a mask.

8. The pattern forming method of claim 7, wherein the solution is a supersaturated solution containing silica.

9. The pattern forming method of claim 7, wherein the exposure is carried out by using ultraviolet rays, X rays or electron beam.

10. The pattern forming method of claim 7, wherein the resist film includes a resin with acid anhydride structure.

11. The pattern forming method of claim 7, wherein the resist film includes a methacrylic acid anhydride resin or an acrylic acid anhydride resin.

12. The pattern forming method of claim 7, wherein the resist film includes a novolac series resin.

13. A pattern forming method, comprising: coating a hydrophobic resist film on a substrate;
   exposing the resist film to a prescribed pattern causing an exposed region to become hydrophilic;
   baking the substrate;
   selectively extracting and depositing an oxide film from a silica solution on the hydrophilic region of the substrate; and
   etching the resist film using the oxide film.

14. The pattern forming method of claim 13, wherein the solution is a supersaturated solution containing silica.

15. The pattern forming method of claim 13, wherein the exposure is carried out by using ultraviolet rays, X rays or electron beam.

16. The pattern forming method of claim 13, wherein the resist film includes a resin with acid anhydride structure.

17. The pattern forming method of claim 13, wherein the resist film includes a methacrylic acid anhydride resin or acrylic acid anhydride resin.

18. The pattern forming method of claim 13, wherein the resist film includes a novolac series resin.

19. A pattern forming method, comprising:
   coating a hydrophobic resist film on a substrate having a silicon layer thereon;
   exposing the resist film to a prescribed pattern causing an exposed region to become hydrophilic;
   selectively extracting and depositing a first mask material from a liquid solution on the hydrophilic region of the substrate;
   etching the resist film using the first mask material and exposing a part of the silicon layer on the surface of the substrate;
   selectively extracting and depositing from the solution a second mask material on the exposed silicon layer; and selectively removing the resist film by a lift-off process and patterning the silicon layer using the second mask material.

20. The pattern forming method of claim 19, wherein the solution is a supersaturated solution containing silica.

21. The pattern forming method of claim 19, wherein the resist film includes a methacrylic acid anhydride resin and an acrylic acid anhydride resin.

22. The pattern forming method of claim 19, wherein the resist film includes a novolac series resin.

* * * * *